(12) United States Patent
Lim et al.

(10) Patent No.: US 6,468,880 B1
(45) Date of Patent: Oct. 22, 2002

(54) METHOD FOR FABRICATING COMPLEMENTARY SILICON ON INSULATOR DEVICES USING WAFER BONDING

(75) Inventors: Yeow Kheng Lim, Singapore (SG); Randall Cher Liang Cha, Singapore (SG); Alex See, Singapore (SG); Tae Jong Lee, Orlando, FL (US); Wang Ling Goh, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/805,954

(22) Filed: Mar. 15, 2001

(51) Int. Cl.[7] .................. H01L 21/30; H01L 21/44; H01L 21/301
(52) U.S. Cl. .................. 438/459; 438/311; 438/406; 438/977; 257/347
(58) Field of Search .................. 438/197, 311, 438/347, 692, 459, 406, 977, FOR 107, FOR 222, FOR 485; 257/347

(56) References Cited

U.S. PATENT DOCUMENTS

| | | | |
|---|---|---|---|
| 4,169,000 A | | 9/1979 | Riseman .................. 148/187 |
| 5,102,819 A | * | 4/1992 | Matsushita et al. .......... 437/52 |
| 5,484,738 A | | 1/1996 | Chu et al. .................. 437/33 |
| 6,010,950 A | * | 1/2000 | Okumura et al. .......... 438/455 |
| 6,013,936 A | | 1/2000 | Colt, Jr. .................. 257/506 |
| 6,071,803 A | | 6/2000 | Rutten et al. .............. 438/618 |
| 6,084,271 A | | 7/2000 | Yu et al. .................. 257/351 |
| 6,313,507 B1 | * | 11/2001 | Lee .......................... 257/347 |
| 6,329,239 B2 | * | 12/2001 | Koh et al. ................ 438/253 |
| 6,335,214 B1 | * | 1/2002 | Fung .......................... 438/30 |
| 6,399,973 B1 | * | 6/2002 | Roberds .................. 257/288 |
| 6,417,030 B1 | * | 7/2002 | Buynoski et al. ........ 438/149 |

* cited by examiner

*Primary Examiner*—Wael Fahmy
*Assistant Examiner*—Fernando Toledo
(74) *Attorney, Agent, or Firm*—George O. Saile; Rosemary L. S. Pike; William J. Stoffel

(57) ABSTRACT

A method to form a silicon on insulator (SOI) device using wafer bonding. A first substrate is provided having an insulating layer over a first side. A second substrate is provided having first isolation regions (e.g., STI) that fill first trenches in the second substrate. Next, we bond the first and second substrate together by bonding the insulating layer to the first isolation regions and the second substrate. Then, a stop layer is formed over the second side of the second substrate. The stop layer and the second side of the second substrate are patterned to form second trenches in the second substrate. The second trenches have sidewalls at least partially defined by the isolation regions and the second trenches expose the second insulating layer. The second trenches define first active regions over the first isolation regions (STI) and define second active regions over the insulating layer. Next, the second trenches are filled with an insulator material to from second isolation regions. Next, the stop layer is removed. Lastly, devices are formed in and on the active regions.

14 Claims, 3 Drawing Sheets

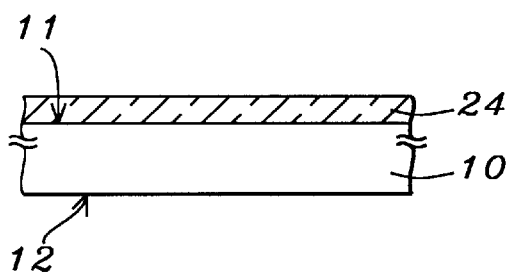
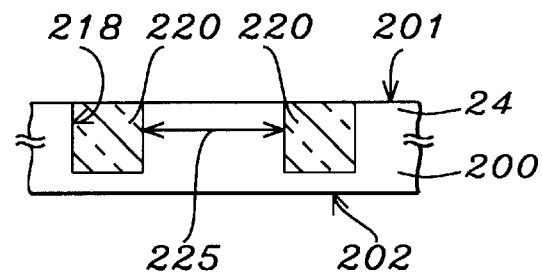
FIG. 1A  FIG. 1B
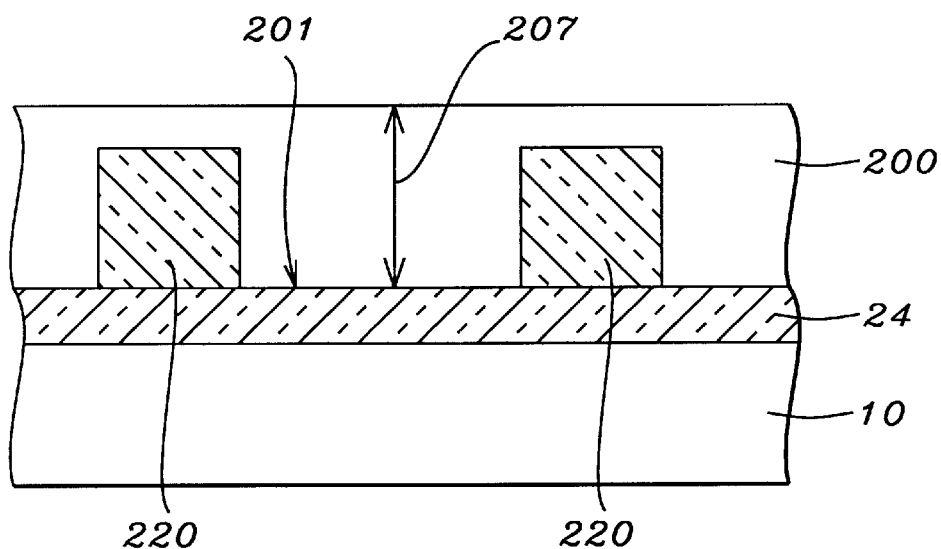
FIG. 2
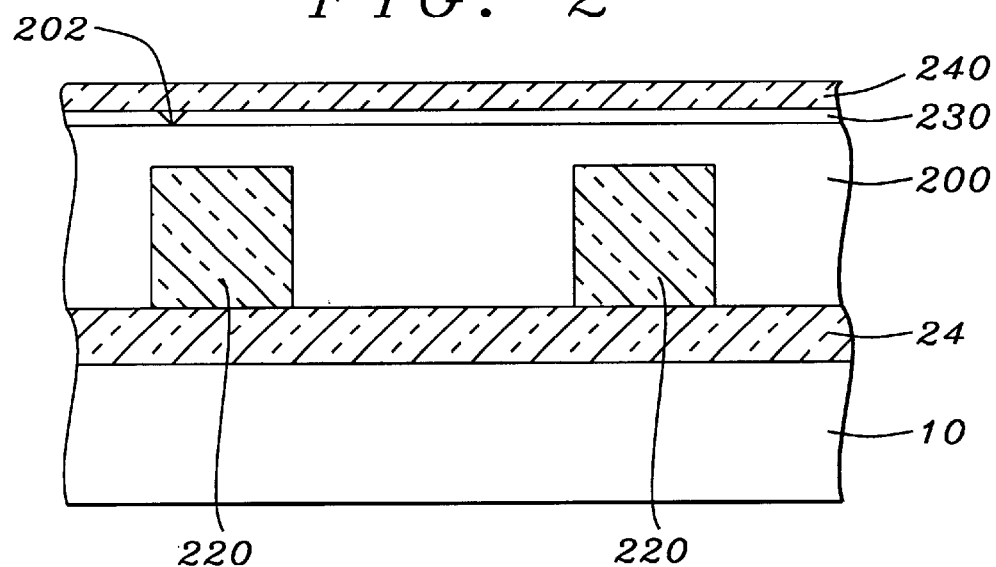
FIG. 3

METHOD FOR FABRICATING COMPLEMENTARY SILICON ON INSULATOR DEVICES USING WAFER BONDING

BACKGROUND OF INVENTION

1) Field of the Invention

This invention relates generally to fabrication of semiconductor devices and more particularly to the fabrication of a Silicon on insulator (SOI) devices and more particularly to a method for fabricating complementary silicon on insulator (CSOI) devices that can be partially depleted and fully depleted (or accumulated) using wafer bonding.

2) Description of the Prior Art

Typical prior art bulk silicon such as diodes, field effect transistors (FETs) and bipolar transistors formed on a silicon wafer are subject to parasitic effects resulting from other bulk devices in close proximity and from vertical structural asymmetry. These parasitic effects include voltage limitations and cross-device interference.

Consequently, typical bulk semiconductor processes, especially FET processes that include both p-type FETs (PFETs) and n-type FETS (NFETs) and commonly referred to as CMOS, require dedicated structures to localize and reduce parasitic effects. These specialized structures include providing surface diffusions referred to as guard rings, individual doped wells (N-wells and/or P-wells) and including a buried insulator.

Silicon on insulator (SOI) devices have been dubbed as the next successor to the reigning Complementary Metal On Silicon (CMOS) devices. Silicon on insulator (SOI) has excellent isolation properties. Silicon on insulator (SOI) has existed for almost two decades, but still improved methods for making silicon on insulator (SOI) devices are needed to advance the technology.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 6,084,271(Yu et al.) shows a silicon on insulator (SOI) process using wafer bonding and STI's. U.S. Pat. No. 4,169,000(Riseman) shows a STI air gap and a wafer bonded thereover. U.S. Pat. No. 6,071,803(Rutten et al.) shows a contact to a buried SOI process using wafer bonding and STI's. U.S. Pat. No. 6,013,936(Colt, Jr.) teaches a double SOI device. U.S. Pat. No. 5,484,738(Chu et al.) teaches a bonded SOI device/process.

Thus, there is a need for individually isolated semiconductor devices that may be integrated into a single circuit on a single chip.

SUMMARY OF THE INVENTION

It is an object of the present invention to provide a method to form a silicon on insulator (SOI) device.

It is an object of the present invention to provide a method to form a silicon on insulator (SOI) device that uses wafer bonding technique.

It is an object of the present invention to provide a method to form a silicon on insulator (SOI) device that uses wafer bonding technique that can be use to form fully and partially depleted complementary devices on the same wafer.

It is an object of the present invention to provide a method to form silicon on insulator devices that use either controlled Si wafer back grinding process or a controlled Wet Si wafer etch.

Briefly, the invention describes a method for a silicon on insulator (SOI) structure by forming shallow trench isolation (STI) regions on a first wafer, wafer bonding the first and a second wafer together, backside grinding the second wafer, patterning the second wafer to form second trenches in the second wafer, and depositing an insulator in the second trenches to isolate the active areas (e.g., silicon) of the remaining second wafer.

The method preferably comprises the following steps. A first substrate is provided having an insulating layer over a first side of the first substrate. The first substrate has a second side. A second substrate is provided having first trenches in a first side. The second substrate has a second side. We form first isolation regions (e.g., STI) that fill the trenches in the second substrate. Next, we bond the first and second substrate together by bonding the insulating layer to the first isolation regions and the second substrate. Then, preferably the second substrate is thinned by a process that removes material from the backside of the second substrate. Then, a stop layer is formed over the second side of the second substrate. The stop layer and the second side of the second substrate are patterned to form second trenches in the second substrate. The second trenches have sidewalls at least partially defined by the isolation regions and the second trenches expose the second insulating layer. The second trenches define first active regions over the first isolation regions (STI) and define second active regions over the insulating layer. Next, the second trenches are filled with an insulator material to from second isolation regions. The filling of the second trenches with an insulator material preferably comprises forming an oxide layer over the stop layer and filling the second trenches. The oxide layer is preferably chemical-mechanical polished (CMP) using the stop layer as a CMP stop. Next, the stop layer is removed. Lastly, fully depleted devices are formed in and on the first active regions. Also, partially depleted devices are formed in and on the second active regions. The fully depleted devices and the partially depleted devices are comprised of MOS FET devices comprised of source and drain regions and gate electrodes.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1A and 1B, and 2 to 6 are cross sectional views for illustrating a method for manufacturing a SOI device according to the present invention.

DETAILED DESCRIPTION OF THE PREFERRED EMBODIMENTS

Figure 4:
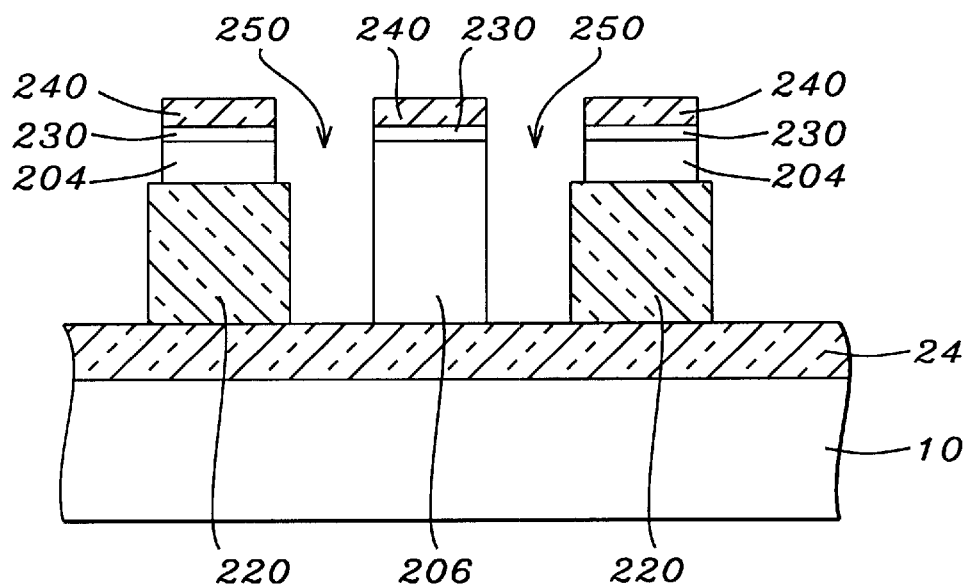

The present invention will be described in detail with reference to the accompanying drawings. The present invention provides a method of forming a silicon on insulator (SOI) device.

As shown in FIG. 1A, a first substrate (e.g., wafer) is provided having an insulating layer 24 over a first side 11 of the first substrate 10. The first substrate 10 has a second side 12. The first substrate 10 is preferably comprised of monocrystalline silicon with a p-type doping of approximately 1E16 atom/cc. However, a substrate (e.g., wafer) with a different doping concentration and/or N-type doping could be used, depending on the final device requirements.

Referring to FIG. 1B, we provide a second substrate 200 (e.g., wafer) that has first trenches 218 in a first side 201. The second substrate 200 has a second side 202. The second substrate 200 is preferably comprised of silicon. The second substrate is preferably comprised of silicon with a p-type doping of approximately 1E16 atom/cc. However, a substrate (e.g., wafer) with a different doping concentration and/or N-type doping could be used, depending on the final device requirements.

The trenches 218 have a width between 2000 and 3000 Å.

Still referring to FIG. 1B, we form first isolation regions (e.g., STI) 220 that fill the trenches 218 in the second substrate 200. The first isolation regions can be fabricated using conventional shallow trench isolation (STI) methods.

Referring to FIG. 2, the insulating layer 24 is bonded or fused to the first isolation regions 220 and the second substrate 200. The second substrate 200 is inverted and bonded to the first substrate 10. The first side 201 of the second substrate 200 is bonded facing the first side 11 of the first substrate 10. The first and second substrates are bonded using conventional bonding techniques. A conventional bonding process may be used to form the structure shown in FIG. 2 to the insulating layer 24. For example, the assembly is cleaned and then is subjected to a oxygen gas and a temperature in the range of 850° C. to 1100° C.

Next, a portion of the second side 202 of the second substrate 202 is removed using conventional techniques such as a KOH etch back or a grinding process. Preferably a KOH etch back is used. After the thinning of the second substrate, the second substrate 200 preferably has a thickness 207 of between about 1000 and 2000 Å. A surface treatment is preferably performed on the silicon face such as a clean and anneal. The clean removes K mobile ions which may end up in the gate oxide. The anneal repairs surface defects, especially if the second substrate undergoes backside grinding. A large gap over the whole wafer is preferred as it can raise only a "skin" layer of Si, (e.g., 500 Å) to melt and then followed by re-crystallization to get a defect-free surface 202 for building devices.

As shown in FIG. 3, we form a (optional) stop layer (230 240) (e.g., CMP stop layer) over the second side 202 of the second substrate 200. The stop layer will be used as a CMP stop in a later chemical-mechanical polish (CMP) planarization step.

The stop layer 230 240 is preferably comprised of a lower oxide layer 230 and an upper nitride layer 240. The lower oxide layer has a thickness of between about 100 and 200 Å. The upper nitride layer 240 has a thickness of between about 1500 and 2500 Å.

As shown in FIG. 4, we pattern the stop layer 230 240 and the second side 220 of the second substrate 200 using conventional photolithography techniques (e.g., resist, expose, develop and etch). This forms second trenches 250 in the second substrate 220.

The second trenches 250 preferably have sidewalls at least partially defined by the isolation regions 220 and the second trenches 250 expose the insulating layer 24. The second trenches 250 define first active regions 204 (e.g., where fully FET depleted devices will be formed in a later step) over the first isolation regions (STI) 220. The second trenches 250 also define second active regions 206 (e.g., where partially depleted FET devices will be formed in a later step) over the insulating layer 24. Active areas are the remaining portions of the second substrate.

Figure 5:
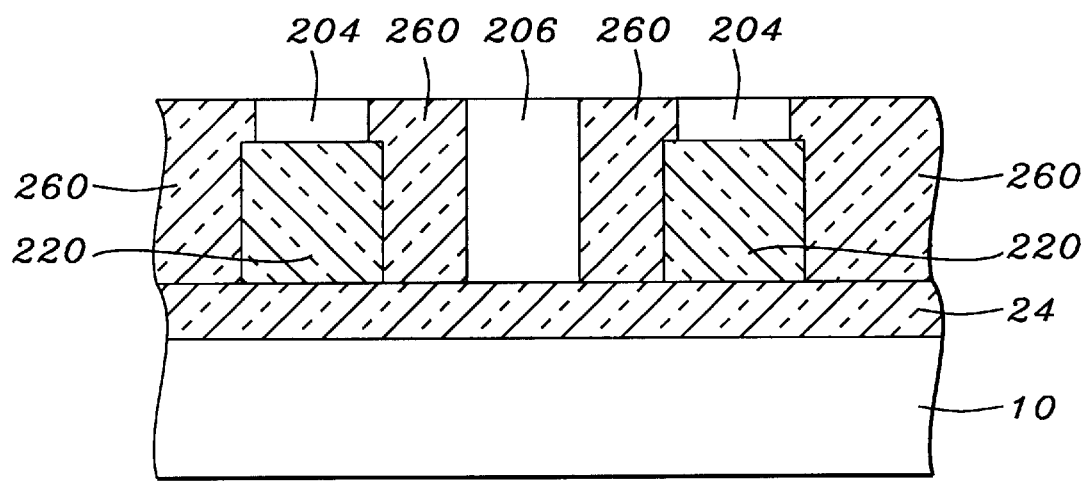

As shown in FIG. 5, the second trenches 250 are filled with an insulator material to form second isolation regions 260.

The filling of the second trenches 250 with an insulator material preferably comprises forming an oxide layer over the stop layer and filling the second trenches. Next, we chemical-mechanical polish (CMP) the oxide layer using the stop layer 230 240 as a CMP stop. The stop layer (e.g., oxide nitride stack) protects the active areas 204 206 during the CMP and acts a CMP stop. The stop layer is important in preventing defects in the active areas from the CMP process.

Next, the stop layer is removed 230 240. The stop layer can be removed the CMP process (above) or by a selective wet or dry etch.

Figure 6:
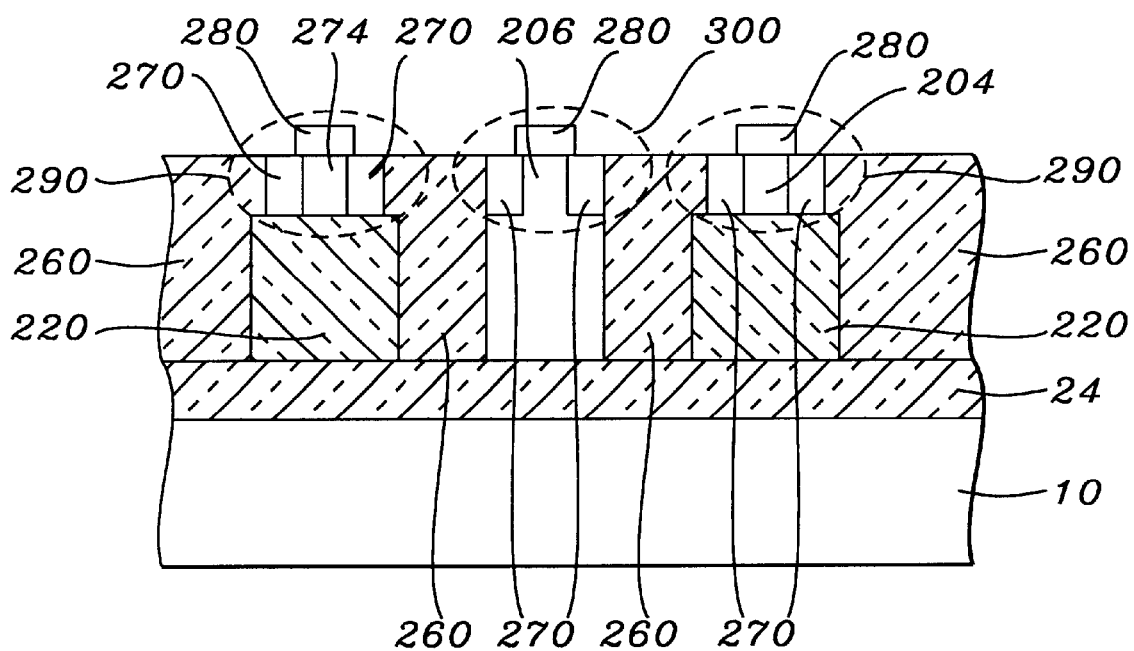

As shown in FIG. 6, devices can be fabricated in these regions using conventional process steps dictated by the type or types of devices desired. For example, we can form fully depleted FET devices 290 in and on the first Active regions 204 and form partially depleted devices 300 in and on the second active regions 206. Depleted and accumulated FET devices differ in the type of doping (p or n) in the channel region of the FET. Partially deleted and fully depleted refers the level of doping in a depleted FET device.

In addition, the active areas can be doped to form N-well and or p-well so that NMOS and PMOS (or PFET and NFET) devices in both (partial and full) depletion and accumulation styles can be formed on the same wafer. Obviously, other devices can be formed in and on the active regions, such as resistors and capacitors and CMOS inverters.

The fully depleted devices 290 and the partially depleted devices 300 are comprised of MOS FET devices comprised of source and drain regions 270, center (e.g., channel) regions 274 and gate electrodes structures 280. A gate dielectric and gate electrode are formed on the active areas. Then Source/drain (S/D) are formed adjacent to the gate structures 280 preferably by an ion implant process.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

In the above description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention. Also, the flow rates in the specification can be scaled up or down keeping the same molar % or ratios to accommodate difference sized reactors as is known to those skilled in the art.

While the invention has been particularly shown and described with reference to the preferred embodiments thereof, it will be understood by those skilled in the art that various changes in form and details may be made without departing from the spirit and scope of the invention. It is intended to cover various modifications and similar arrangements and procedures, and the scope of the appended claims therefore should be accorded the broadest interpretation so as to encompass all such modifications and similar arrangements and procedures.

What is claimed is:

1. The method of fabrication of a silicon on insulator (SOI) device; comprising the steps of:
    a) providing a first substrate having an insulating layer over a first side of said first substrate; said first substrate has a second side;
    b) providing a second substrate having first trenches in a first side; said second substrate have a second side;
    c) forming first isolation regions that fill said first trenches in said second substrate;
    d) bonding said insulating layer to said first isolation regions and said second substrate;
    e) thinning said second side of said second substrate;
    f) etching and patterning said second side of said second substrate to form second trenches in said second substrate; said second trenches have sidewalls at least partially defined by said isolation regions and said second trenches expose said insulating layer; said second trenches define first active regions over said first isolation regions (STI) and define second active regions over said insulating layer;
    g) filling said second trenches with an insulator material to from second isolation regions;
    h) forming devices in and on said first active regions; and in and on said second active regions.

2. The method of claim 1 wherein said first substrate is comprised of monocrystalline silicon.

3. The method of claim 1 wherein said second substrate is a comprised of monocrystalline silicon.

4. The method of claim 1 wherein said first trenches have a width between 2000 and 3000 Å.

5. The method of claim 1 wherein the thinning of said second side of said second substrate comprises etching said second substrate in KOH so that said second substrate has a thickness of between about 1000 and 2000 Å.

6. The method of claim 1 wherein the thinning of said second side of said second substrate comprises grinding said second substrate so that said second substrate has a thickness of between about 1000 and 2000 Å.

7. The method of claim 1 wherein the filling of said second trenches with an insulator material comprises forming an oxide layer filling said second trenches; and chemical-mechanical polish said oxide layer.

8. The method of claim 1 wherein said devices are comprised of MOS FET devices comprised of source and drain regions and gate electrodes.

9. The method of claim 1 wherein said devices that are formed on said first active regions are fully depleted FET devices and said devices formed on said second active regions are partially depleted FET devices comprised of source and drain regions and gate electrodes.

10. The method of fabrication of a silicon on insulator (SOI) device; comprising the steps of:
    a) providing a first substrate having an insulating layer over a first side of said first substrate; said first substrate has a second side;
    b) providing a second substrate having first trenches in a first side; said second substrate have a second side;
    c) forming first isolation regions that fill said first trenches in said second substrate;
    d) bonding said insulating layer to said first isolation regions and said second substrate;
    e) thinning said second side of said second substrate;
        (1) the thinning of said second side of said second substrate comprises etching said second substrate in KOH so that said second substrate has a thickness of between about 1000 and 2000 Å;
    f) forming a stop layer over said second side of said second substrate;
        (1) said stop layer comprised of a lower oxide layer and an upper nitride layer; said lower oxide layer has a thickness of between about 100 and 200 Å; said upper nitride layer has a thickness of between about 1500 and 2500 Å;
    g) etching and patterning said stop layer and said second side of said second substrate to form second trenches in said second substrate; said second trenches having sidewalls at least partially defined by said isolation regions and said second trenches expose said insulating layer; said second trenches define first active regions over said first isolation regions (STI) and define second active regions over said insulating layer;
    h) filling said second trenches with an insulator material to from second isolation regions;
        (1) the filling of said second trenches with an insulator material comprises forming an oxide layer over said stop layer and filling said second trenches; and chemical-mechanical polish (CMP) said oxide layer using said stop layer as a CMP stop;
    i) removing said stop layer;
    j) forming fully depleted devices in and on said first active regions; and forming partially depleted devices in and on said second active regions.

11. The method of claim 10 wherein said second substrate is comprised of silicon.

12. The method of claim 10 wherein said first substrate is comprised of silicon.

13. The method of claim 10 wherein said first trenches have a width between 2000 and 3000 Å.

14. The method of claim 10 wherein includes said devices and are comprised of MOS FET devices comprised of source and drain regions and gate electrodes.

* * * * *